(12) United States Patent
Walker et al.

(10) Patent No.: US 9,529,771 B2
(45) Date of Patent: Dec. 27, 2016

(54) COMMUNICATION SYSTEM (75) Inventors: Christopher Paul Hulme Walker, Milton Keynes (GB); Barry Michael Cook, Shropshire (GB)

(73) Assignee: 4LINKS LIMITED, Milton Keynes (GB)

(*) Notice: Subject to any disclaimer, the term of this patent is extended or adjusted under 35 U.S.C. 154(b) by 1413 days.

(21) Appl. No.: 12/890,122

(22) Filed: Sep. 24, 2010

(65) Prior Publication Data

US 2011/0013707 A1 Jan. 20, 2011

Related U.S. Application Data

(62) Division of application No. 10/569,394, filed as application No. PCT/GB2004/003608 on Aug. 23, 2004, now Pat. No. 7,826,566.

(30) Foreign Application Priority Data

Aug. 22, 2003 (GB) .................................. 0319756.3
Oct. 28, 2003 (GB) .................................. 0325165.9

(51) Int. Cl.
| | | |
|---|---|---|
| *H04L 27/00* | (2006.01) | |
| *G06F 13/42* | (2006.01) | |
| *H03M 5/14* | (2006.01) | |
| *H04L 7/033* | (2006.01) | |
| *H04L 25/49* | (2006.01) | |
| *H04L 1/00* | (2006.01) | |

(Continued)

(52) U.S. Cl.
CPC ............ *G06F 13/4295* (2013.01); *H03M 5/14* (2013.01); *H04L 7/005* (2013.01); *H04L 7/033* (2013.01); *H04L 25/4904* (2013.01); *H04L 1/0002* (2013.01); *H04L 7/0008* (2013.01); *H04L 7/048* (2013.01)

(58) Field of Classification Search
CPC .............. H04L 1/1809; H04L 12/1868; H04L 12/1895; H04L 12/407; H04L 29/06; H04L 1/16; H04L 1/1816; H04B 7/18539
USPC ......................................... 375/219, 295, 316
See application file for complete search history.

(56) References Cited

U.S. PATENT DOCUMENTS

| | | |
|---|---|---|
| 4,972,507 A | 11/1990 | Lusignan |
| 5,146,477 A | 9/1992 | Cantoni et al. |

(Continued)

OTHER PUBLICATIONS

Real, "RealJukebox 2 Manual", Copyright Year is 2000, weblink: http://service.real.com/help/library/guides/jukebox2plus/rj2.htm public availability as early as Feb. 23, 2004 according to web.archive.org.*

(Continued)

*Primary Examiner* — David S Huang
(74) *Attorney, Agent, or Firm* — Sallwanchik, Lloyd & Eisenschenk (57) ABSTRACT

There is disclosed a method and apparatus for recovering data from a received signal, the received signal including a first signal comprising data bits and a second signal having transitions at data bit boundaries of the first signal where there is an absence of transitions, the method comprising: receiving the first signal; receiving the second signal; sampling the first signal to detect an edge transition of the first signal; sampling the second signal to detect an edge transition of the second signal; wherein on an active edge of either said first or said signal, the current value of the first signal is recovered as a received data bit.

18 Claims, 7 Drawing Sheets

(51) Int. Cl.
  *H04L 7/00* (2006.01)
  *H04L 7/04* (2006.01)

(56) References Cited

U.S. PATENT DOCUMENTS

| | | |
|---|---|---|
| 5,341,371 A | 8/1994 | Simpson |
| 5,465,268 A | 11/1995 | Rainbolt |
| 5,598,417 A | 1/1997 | Crisler et al. |
| 5,911,062 A | 6/1999 | Taki |
| 5,942,937 A | 8/1999 | Bell |
| 5,948,085 A | 9/1999 | Blatter et al. |
| 2003/0206549 A1* | 11/2003 | Mody et al. .................. 370/390 |

OTHER PUBLICATIONS

Whodat, DJ. "Crossfading that Works." Feb. 17, 2002. http://forums.winamp.com/showpost.php?p=482481&postcount=1.*
European Cooperation for Space Standardization, "Space engineering—SpaceWire—Links, nodes, routers and networks", Jan. 24, 2003, *European Cooperation for Space Standardization*, pp. 1-124, ESA-ESTEC, Noordwijk, NL, XP007902495.
Shenker et al., "Specification of Guaranteed Quality of Service", *IETF Standard, Internet Engineering Task Force*, IETF, CH, Sep. 1, 1997, XP015007996.

* cited by examiner

FIG. 8

COMMUNICATION SYSTEM

CROSS-REFERENCE TO A RELATED APPLICATION

This application is a divisional application of co-pending U.S. application Ser. No. 10/569,394, filed Feb. 22, 2006; which is a National Stage Application of International Application No. PCT/GB2004/003608, filed Aug. 23, 2004; which claims priority to Great Britain Application Nos. 0319756.3, filed Aug. 22, 2003 and 0325165.9, filed Oct. 28, 2003; which are incorporated herein by reference in their entirety.

FIELD OF THE INVENTION

The present invention relates to data or information communication systems. The invention is particularly, but not exclusively, related to data transmitted as a so-called data-strobe pair.

BACKGROUND OF THE INVENTION

The SpaceWire Standard, ECSS-E-50-12A, 24 Jan. 2003, provides a formal basis for the exploitation of SpaceWire technology in a wide-range of on-board processing systems, with particular application to the Space Industry.

SpaceWire uses so-called data-strobe encoding. This is a coding scheme which, at the transmitter side, encodes the transmission clock with the data into respective data and strobe signals. The data values are transmitted directly as the data signal, and the strobe signal is controlled to change state whenever the data remains constant from one data bit interval to the next. Thus, between them, the data and strobe signals have a transition on every bit boundary.

A SpaceWire link comprises two pairs of differential signals, one pair transmitting the data and strobe signals in one direction, and the other pair transmitting the data and strobe signals in the other direction. Thus there is provided a total of eight wires for each bi-directional SpaceWire link. The data-strobe encoding scheme is also used in IEEE 1355-1995 and IEEE 1394-1995 (FireWire) standards, and is well-known.

Figure 1:
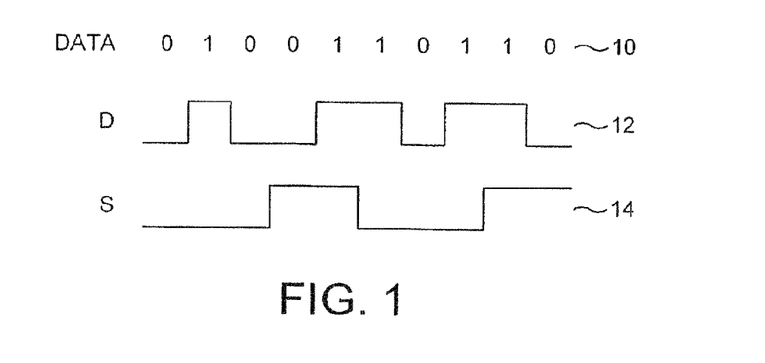
FIG. 1 illustrates the principle of data-strobe encoding.

The data-strobe encoding principle is illustrated in FIG. 1. The data bit stream is generally designated by reference numeral 10. The data signal is generally designated by reference numeral 12, and follows the data bit stream, i.e. is high when the data bit is 1, and is low when the data bit is 0. The strobe signal is generally designated by reference numeral 14. The strobe signal changes state whenever the data does not change state from one bit to the next.

At the receiver side, the transmit clock may then be recovered by a simple XOR operation on the data and strobe signals. The thus recovered transmit clock may then be used to decode the data signal.

The use of the exclusive-OR technique to recover the clock from the data-strobe signals requires tight constraints on transmission line skew between the two signals. This means that relatively expensive transmission lines must be used. The use of the exclusive-OR technique also means that the operation of the receiver is asynchronous.

In SpaceWire systems, a time-code providing timing information for a data-strobe link is transmitted from one node of a link to another node of the link responsive to a request for such time code. The time code is transmitted, responsive to such request, when a current transmission is finished. As the length of the current transmission may vary, the time delay between receipt of a request and transmission of a time code may vary. This variation introduces jitter into the communication system, which is generally undesirable. Jitter may also generally be caused by variations in transmissions caused by latency in a communication link between two or more nodes.

The data-strobe signalling used in SpaceWire further conforms to a standardised communication specification, and the data and control information transmitted is limited to that facilitated by the standards. It is not possible to transmit information not defined by the standard between nodes using the data-strobe signalling.

BRIEF SUMMARY OF THE INVENTION

It is an aim of an aspect of the present invention to provide an improved technique for the recovery of data from a received signal pair.

It is an aim of a further aspect of the present invention to reduce jitter caused by the transmission of information.

It is an aim of a still further aspect of the present invention to enhance the information provided in a transmitted information signal.

In one aspect there is presented a method of recovering data from a received signal, the received signal including at least one first signal comprising data bits and a second signal having transitions at data bit boundaries of the at least one first signal where there is an absence of transitions, the method comprising sampling the at least one first signal and the second signal to recover the data in the at least one first signal. The method may further comprise combining the sampled at least one first signal and the sampled second signal. The steps of sampling the at least one first signal and the at least one second signal may include detecting an edge of said signals. The step of combining the sampled at least one first signal and the sampled second signal may include detecting an edge on either of said signals. The step of detecting an edge on either of said signals may include generating successive samples of each single, and comparing said successive samples, wherein a high data level on only one or the other of the successive data signal samples for each signal represents detection of an edge on that signal. Detection of an edge on either of said signals may be indicative of a valid data bit on the at least one first signal.

The valid data bit may be clocked by a sample clock. There may be provided a single sample rate. There may be provided multiple sample rates. The at least one first signal and the second signal may be sampled at different rates. The at least one first signal and the second signal may be sampled by a multi-phase clock. The clock may be a quadrature clock and four samples per clock period may be provided for the at least one first signal and the second signal.

At least one of said at least one first signal and said at least one second signal may be delayed prior to sampling. Said signal may be delayed to allow sampling at a slower clock rate than the data transmission rate.

The at least one first signal and the second signal may comprise a data-strobe pair.

In an aspect the invention provides a method of recovering data from a received signal, the received signal including a first signal comprising data bits and a second signal having transitions at data bit boundaries of the first signal where there is an absence of transitions, the method comprising: receiving the first signal; receiving the second signal; sampling the first signal to detect an edge transition of the first signal; sampling the second signal to detect an edge transition of the second signal; wherein on an active edge of either said first or said signal, the current value of the first signal is recovered as a received data bit.

The received signal may include at least one further signal comprising data bits, the second signal having transitions at boundaries where no data signal has a transition.

In an aspect there is provided a decoder for recovering data from a received signal, the received signal including at least one first signal comprising data bits and a second signal having transitions at data bit boundaries of the at least one first signal where there is an absence of transitions, the decoder comprising sampling means for sampling the at least one first signal and the second signal to recover the data in the at least one first signal.

The decoder may further comprise combining means for combining the sampled at least one first signal and the sampled second signal.

The sampling means may include edge detection means for detecting an edge of said signals.

The combining means may include detecting means for detecting an edge on either of said signals. The detecting means may include means for generating successive samples of each signal, and exclusive-OR means for comparing said successive samples, wherein a high output on the exclusive-OR means represents detection of an edge on that signal.

Detection of an edge by the detecting means may be indicative of a valid data bit on the at least one first signal. The valid data bit may be clocked by a sample clock.

There may be provided a sample clock having single sample rate. There may be provided a single clock or multiple clocks providing a multiple sample rate. The at least one first signal and the second signal may be sampled at different rates. The at least one first signal and the second signal may be sampled by a multi-phase clock.

The clock may be a quadrature clock and four samples per clock period may be provided for the at least one first signal and the second signal.

The decoder may further include at least one delay means, wherein at least one of said at least one first signal and said at least one second signal is delayed in said delay means prior to sampling.

Said signal may be delayed in said delay means to allow sampling at a slower clock rate than the data transmission rate.

The at least one first signal and the second signal may comprise a data-strobe pair.

In an aspect of the invention there is provided a decoder for recovering data from a received signal, the received signal including a first signal comprising data bits and a second signal having transitions at data bit boundaries of the first signal where there is an absence of transitions, the decoder comprising: receiving means for receiving the first signal; receiving means for receiving the second signal; sampling means for sampling the first signal to detect an edge transition of the first signal; sampling means for sampling the second signal to detect an edge transition of the second signal; and combining means connected to the sampling means, wherein on an active edge of either said first or said signal, the current value of the first signal is recovered as a received data bit.

The received signal may include at least one further signal comprising data bits, the second signal having transitions at boundaries where no data signal has a transition.

In an aspect there is provided a method of transmitting information, comprising: receiving a request for information; transmitting said information after completion of a current information transmission; and selectively adjusting the transmission of said information such that a reference mark associated with said information is a fixed time interval after receipt of the request.

Said reference mark may be one of: a start of the transmission of the information; an intermediate point of the transmission of the information; an end of the transmission of the information; a fixed time after completion of the transmission of the information.

The transmission of said information may be adjusted by inserting delays in the transmitted signal. The delay may be a block delay. The delay may be spread throughout the transmission.

The delay may comprise inserting a delay with one or more transmitted bits.

The transmission of said information may be adjusted by varying the transmission speed of the transmitted signal. The information may be a time code of a SpaceWire system.

The step of selectively adjusting the transmission of the information may comprise determining the length of the current transmission after receipt of the request, and determining the difference between said length and said predetermined fixed time, and adjusting the transmission such that the remaining length of the current transmission is selectively adjusted in order to meet the fixed time constraint. The fixed time interval may be dependent upon a worst-case delay determined by the potential worst-case length of a current information transmission.

The fixed time interval may be dependent upon the worst case delay caused by latency in one of a plurality of transmission links in a system.

The step of selectively adjusting the transmission of the information may comprise determining the latency of the transmission, and determining the difference between said latency and said predetermined fixed time, and adjusting the transmission such that the remaining length of the current transmission is selectively adjusted in order to meet the fixed time constraint.

In an aspect the invention provides a transmitter for transmitting information, comprising: receiving means for receiving a request for information; transmitting means for transmitting said information after completion of a current information transmission; and timing means for selectively adjusting the transmission of said information such that a reference mark associated with said information is a fixed time interval after receipt of the request.

Said reference mark may be one of: a start of the transmission of the information; an intermediate point of the transmission of the information; an end of the transmission of the information; a fixed time after completion of the transmission of the information.

The timing means may insert delays in the transmitted signal. The delay may be a block delay. The timing means may spread the delay throughout the transmission. The timing means may insert a delay with one or more transmitted bits. The timing means may adjust the transmission by varying the transmission speed of the transmitted signal.

The information may be a time code of a SpaceWire system.

The timing means may comprise determining means for determining the length of the current transmission after receipt of the request, and determining means for determining the difference between said length and said predetermined fixed time, and adjusting means for adjusting the transmission such that the remaining length of the current transmission is selectively adjusted in order to meet the fixed time constraint.

The fixed time interval may be dependent upon a worst-case delay determined by the potential worst-case length of a current information transmission.

The fixed time interval may be dependent upon the worst case delay caused by latency in one of a plurality of transmission links in a system.

The timing means may comprise determining means for determining the latency of the transmission, and determining means for determining the difference between said latency and said predetermined fixed time, and adjusting means for adjusting the transmission such that the remaining length of the current transmission is selectively adjusted in order to meet the fixed time constraint.

An aspect of the invention provides a method of encoding data in a transmitted signal, the transmitted signal including at least one first signal comprising information bits, the method comprising varying the bit width of at least one bit period of the transmitted signal, and encoding information in said bit width.

The at least one bit period may comprise a bit period between transmission of data.

The transmitted signal may further include a second signal having transitions at data bit boundaries of the at least one first signal where there is an absence of transitions, the method comprising varying the bit width of at least one data bit, and encoding information in said bit width.

An aspect of the invention provides a method of encoding data in a transmitted signal, the transmitted signal including at least one first signal comprising data bits and a second signal having transitions at data bit boundaries of the at least one first signal where there is an absence of transitions, the method comprising varying the bit width of at least one data bit, and encoding information in said bit width.

The width of the bit may represent the encoded information. The encoded information may comprise at least one bit in the bit width. The encoded information may comprise a sequence of bits in the bit width.

An aspect of the invention provides a method of encoding data in a transmitted signal, the transmitted signal including blocks of transmitted information, the method comprising varying the spacing between at least two successive blocks of information in order to encode further information in said spacing.

An aspect of the invention provides an encoder for encoding data for a transmitted signal, the transmitted signal including at least one first signal comprising information bits, the encoder including means for varying the bit width of at least one bit period of the transmitted signal, and encoding means for encoding information in said bit width.

The at least one bit period may comprise a bit period between transmission of data.

The transmitted signal may further include a second signal having transitions at data bit boundaries of the at least one first signal where there is an absence of transitions, wherein the means for varying varies the bit width of at least one data bit, and the encoding means encodes information in said varied bit width.

An aspect of the invention provides an encoder for encoding data for a transmitted signal, the transmitted signal including at least one first signal comprising data bits and a second signal having transitions at data bit boundaries of the at least one first signal where there is an absence of transitions, the encoder including a means for varying the bit width of at least one data bit, and encoding means for encoding information in said bit width.

The width of the bit may represent the encoded information. The encoded information may comprise at least one bit in the bit width.

The encoded information may comprise a sequence of bits in the bit width.

An aspect of the invention provides an encoder for encoding data for a transmitted signal, the transmitted signal including blocks of transmitted information, the encoder comprising means for varying the spacing between at least two successive blocks of information and encoding means for encoding further information in said spacing.

An aspect of the invention provides a method of transmitting information, comprising: selectively adjusting the transmission of said information such that a reference mark associated with said information is a fixed time interval from a control signal associated with the transmission of said information.

An aspect of the invention provides a transmitter for transmitting information, comprising: means for selectively adjusting the transmission of said information such that a reference mark associated with said information is a fixed time interval from a control signal associated with the transmission of said information.

BRIEF DESCRIPTION OF THE DRAWINGS

The invention will be described hereinafter with regard to exemplary examples and with reference to the drawings, in which:

FIGS. 3(a) to 3(k) illustrate the timing of signals in the data decoder of FIG. 2 for a specific example received signal;

DETAILED DESCRIPTION OF THE INVENTION

Embodiments of the invention are described herein with specific reference to applicability to SpaceWire. The various aspects and embodiments of the invention are not, however, limited to SpaceWire, or to any aspects of any other standard.

In general, selected embodiments of the invention are concerned with the recovery of at least one data signal from a received set of signals including at least one data signal and a further signal, where the further signal has transitions at data boundaries where the data signal does not have transitions. In the embodiment described herein, there are discussed examples having one data signal and the one further signal being a strobe signal, forming a data-strobe pair. The term strobe is used due to its well-understood meaning in this context. However, more generally, the term strobe signal merely refers to a signal having the characteristic of having a signal transition representing the data boundary of a data signal not having a transition at said boundary.

The embodiments of aspects of the invention are not related to any specific data encoding technique.

The invention proposes, in embodiments, sampling the encoded signals, i.e. the data and strobe signals, and recovering the data information by processing these samples. The transmit clock is inherently recovered in recovering the data. Such sampling advantageously allows for the re-timing of the data, to be synchronised to a clock generated in the receiver itself. The re-timing is preferably carried out at the earliest possible stage within the receiver.

There are several ways in which the received encoded data and strobe signals may be sampled. A number of possible implementations are discussed hereinbelow. However in order to assist in understanding embodiments of the invention, an exemplary embodiment is first described utilising a specific illustrative sampling technique. In the described exemplary embodiment it is assumed that the bit period $T_B$ of the encoded data and strobe signals is fixed. The specific sampling technique described is one in which the period of the receiver clock $T_C$ is shorter than the bit period $T_B$. More specifically, in the exemplary embodiment the bit period $T_B$ is approximately three times the clock period $T_C$. In such an arrangement, sampling of the received data and strobe signals need only take place on one clock edge. As discussed further hereinbelow, sampling could be implemented using a multi-phase clock. For example, sampling could take place on both edges of a clock signal if desired, although this is not essential for data recovery. In the example described sampling takes place on the rising edge of the receiver clock signal.

Figure 2:
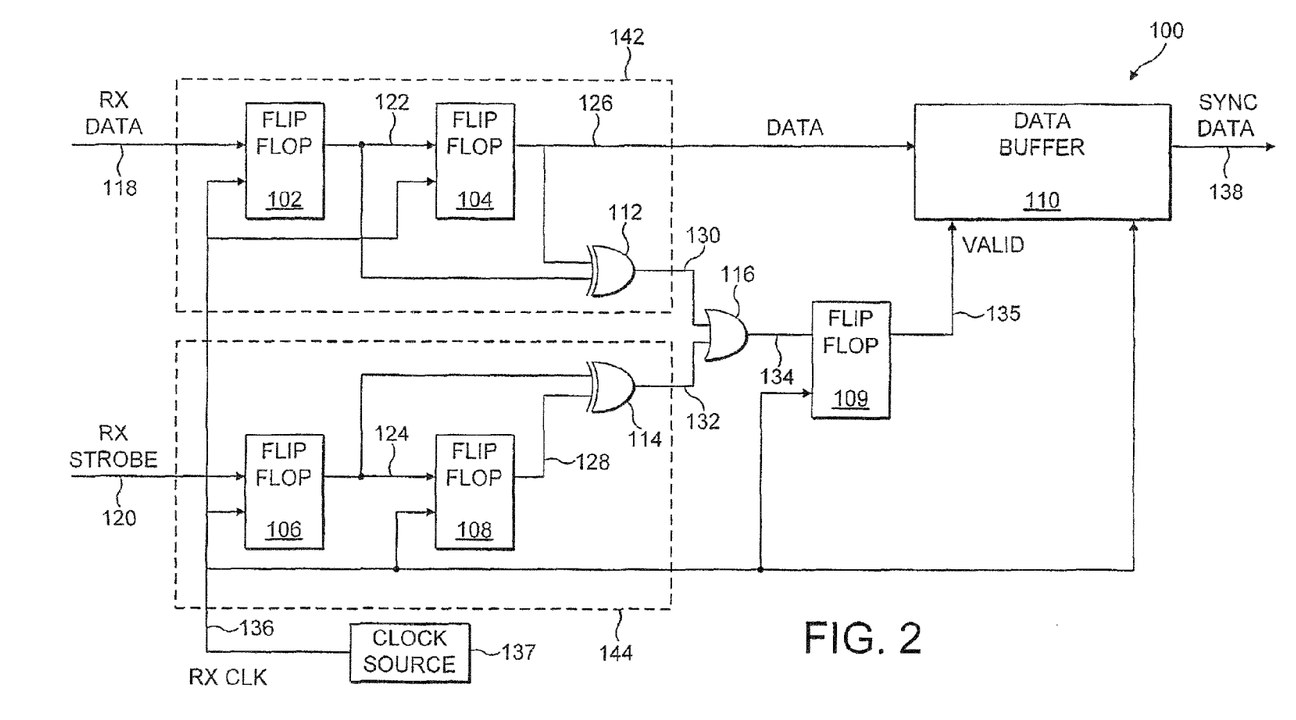
FIG. 2 illustrates an exemplary implementation of a data decoder in an embodiment of the invention.
Figure 3:
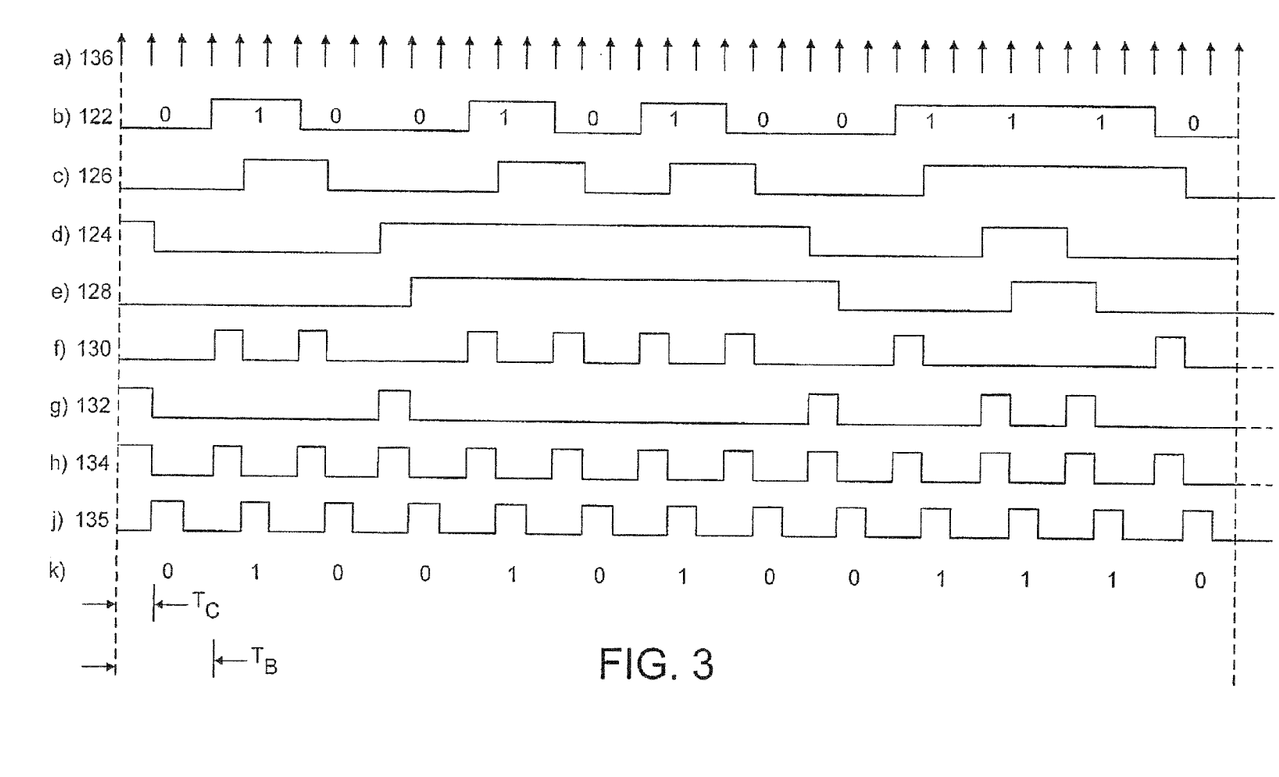

Referring to FIGS. 2 and 3, there is illustrated an exemplary implementation of a data decoder in accordance with an embodiment of the invention. The exemplary implementation is based on a specific example of a received data and strobe signal.

As shown in FIG. 2, a data decoder generally illustrated by reference numeral 100 receives at respective inputs thereof a received data signal RX DATA on line 118 and a received strobe signal RX STROBE on line 120. The data and strobe signals on lines 118 and 120 form a data-strobe pair.

The illustrated embodiment of the data decoder 100 includes five flip-flops 102, 104, 106, 108, 109, two exclusive-or (XOR) gates 112 and 114, an OR gate 116, and a data buffer 110. The data decoder 100 is additionally provided with a receiver clock signal RX CLK on line 136, which corresponds to a clock signal generated internally to a receiver of which the data decoder 100 forms a part. A clock source 137 generates the receiver clock signal RX CLK.

The flip-flop 102 receives at a data input thereof the received data signal RX DATA of the data-strobe pair on line 118. A clocked output of the flip-flop 102 is generated on output line 122, which in turn forms an input to the flip-flop 104. The flip-flop 104 generates a clocked output on signal line 126.

The flip-flop 106 receives at a data input thereof the received strobe signal RX STROBE of the data-strobe pair on line 120. A clocked output of the flip-flop 106 is generated on output line 124, which in turn forms an input to the flip-flop 108. The flip-flop 108 generates a clocked output on signal line 128.

Each of the flip-flops 102, 104, 106, 108 receives as a clock input the receiver clock signal RX CLK on line 136. Each of the respective flip-flops 102, 104, 106 and 108 thus provides at its clocked output the signal at its input on each active edge of the received clock RX CLK.

The XOR gate 112 receives as a first input the clocked output of the flip-flop 102 on line 122, and as a second input the clocked output of the flip-flop 104 on line 126. The XOR gate 114 receives as a first input the clocked output of the flip-flop 106 on line 124 and as a second input the clocked output of the flip-flop 108 on line 128. Thus, the XOR gate 112 receives at its respective inputs the received data signal and a one receiver clock cycle delayed version of the received data signal. The XOR gate 114 receives as its respective inputs the received strobe signal, and a one receiver clock cycle delayed version of the received strobe signal.

The respective XOR gates 112 and 114 generate outputs on signal lines 130 and 132 respectively, which form the inputs to the OR gate 116. The OR gate 116 generates an output signal on line 134.

The output on line 134 forms an input to a data input of the flip-flop 109. The flip-flop 109 receives as a clock input the receiver clock signal on line 136. A clocked output of the flip-flop is provided on an output line 135, which forms a VALID output signal.

The clocked output of the flip-flop 104 on line 126 forms a DATA output which is provided as a data input to the data buffer 110. The VALID signal on line 135 effectively provides a clock signal for clocking the DATA on line 126 into the data buffer 110, as is described in further detail hereinbelow. Data is output from the data buffer 110 in a synchronised manner as SYNC DATA on line 138, under the control of the receiver clock RX CLK on line 136. Thus the data on line 138 is synchronised to the receiver clock RX CLK.

Referring to FIG. 3, the signals in the data decoder 100 at various stages of the decoding operation are shown. FIG. 3(a) illustrates the active (rising) edges of the receiver clock RX CLK on line 136.

The format of example received data and strobe signals on lines 122 and 124 respectively are illustrated in FIGS. 3(b) and 3(d). The signals on lines 122 and 124 correspond to the received signals on lines 118 and 120 delayed by one receiver clock cycle. The received signals shown are illustrative for the purpose of describing an embodiment of the invention.

FIG. 3(b) shows a latched data signal RX DATA on line 122. FIG. 3(d) shows a corresponding latched strobe signal RX STROBE on line 124. As can be seen, and is known in the art, the strobe signal illustrated in FIG. 3(d) has a transition on the bit boundaries where there is no transition for the data signal of FIG. 3(b).

The bit period of a received data bit is denoted by $T_B$. Thus, in combination, the data and strobe signals have a transition at every interval $T_B$.

FIG. 3(c) illustrates the received data signal on line 122 delayed by one further period of the receiver clock RX CLK. The receiver clock period is denoted by $T_C$. FIG. 3(c) thus represents the clocked output of the flip-flop 104 on line 126, being the data signal at the output of the flip-flop 102 delayed by a time $T_C$.

FIG. 3(e) similarly represents the received strobe signal at the clocked output of the flip-flop 106 delayed by one cycle $T_C$ of the received clock RX CLK. Thus FIG. 3(e) illustrates the clocked output on line 128 of the flip-flop 108.

It can thus be understood that the XOR gate 112 provides on its output the exclusive-OR of the received data signal and the received data signal delayed by one clock period of the receiver clock RX CLK. The output of the XOR gate 112 on line 130 is illustrated in FIG. 3(f). As such the flip-flop 102, the flip-flop 104, and the XOR gate 112 form, in combination, an edge detector 142, which detects an edge on the received data signal.

It can also be understood that the XOR gate 114 provides on its output the exclusive-OR of the received strobe signal and the received strobe signal delayed by one clock period of the receiver clock RX CLK. The output of the XOR gate 114 on line 132 is illustrated in FIG. 3(g). As such the flip-flop 106, the flip-flop 108, and the XOR gate 114 form, in combination, an edge detector 144, which detects an edge on the received strobe signal.

The OR gate 116 receives the two outputs on lines 130 and 132 of the edge detectors 142 and 144, and provides the signal on line 134. The signal on line 134 is illustrated in FIG. 3(h).

The output of the flip-flop 109 provides the VALID signal on line 135. The VALID signal on line 135 is illustrated in FIG. 3(j), and is the signal on line 134 delayed by one receiver clock cycle.

The VALID signal on line 135 indicates that the data value on the line 126 is a valid data value. When the VALID signal is high, the value of the data on line 126 is clocked (or captured) into the data buffer 110 on the rising edge of the receiver clock RX CLK and is stored as received data. By reference to FIGS. 3(b) and 3(j), it can be seen that the VALID signal on line 135 transitions high for one active clock cycle of the receive clock RX CLK during each bit period $T_B$, such that the correct received sequence of data is stored into the data buffer 110. The sequence of data clocked into the data buffer 110 under the control of the receiver clock signal RX CLK, when the VALID signal is asserted, is illustrated in FIG. 3(k). This sequence clearly corresponds to the data sequence of the received signal as shown in FIG. 3(b).

The data on line 126 is synchronised to the receiver clock RX CLK. The buffer 110 is not essential, and is not required for synchronisation of data. However, in embodiments the data buffer 110 may be useful for collecting bits prior to decoding. The data thus stored in the buffer 110 may be further read out under the control of the receiver clock RX CLK on line 136. Thus synchronised, collected data SYNC DATA is read out of the data buffer 110 on line 138.

Further processing of the recovered data may then take place, such further processing being outside the scope of the present invention. However in a SpaceWire system the recovered data is then decoded. On the transmit side, symbols are encoded into data. Thus on the receive side, the recovered data is decoded into symbols.

As discussed above, in the exemplary scenario of FIGS. 2 and 3 the clock period is shorter than the bit period, and sampling can therefore be performed on one edge of the receiver clock signal. However the actual sampling technique utilised may be implementation dependent.

Where the clock period is longer than the bit period, but shorter than two bit periods, sampling may be performed on both edges of the receiver clock signal in order to recover the encoded data.

In a further possible arrangement, sampling may be carried out on one or both edges of a set of multi-phase clocks, to ensure that the interval between sampling edges is less than the bit period. This may be necessary where the fastest sampling clock period ($T_C$) available is not shorter than one (or two) data bit periods ($T_B$).

Figure 4:
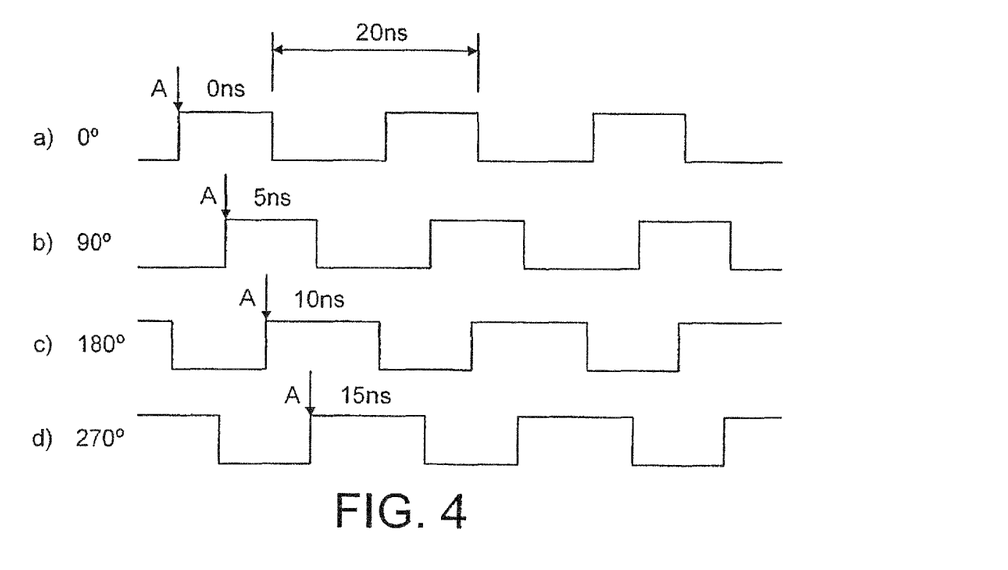
FIG. 4 illustrates a quadrature clock output.

In a preferred embodiment, a quadrature clock is used for sampling purposes. FIG. 4 illustrates an example of the clock signals generated by a quadrature clocking, having an example clock cycle period of 20 ns. The quadrature clock has four outputs, corresponding to four phases of the clock. A first output shown in FIG. 4(a) has a phase of 0°, a second output shown in FIG. 4(b) has a phase of 90°, a third output shown in FIG. 4(c) has a phase of 180°, and a fourth output shown in FIG. 4(d) has a phase of 270°.

As further illustrated in FIG. 4, each phase of the clock has a rising, or active (A), edge in each clock cycle. Thus at the start of the cycle the first phase has an active rising edge, and therefore there are active edges at delays of 5 ns, 10 ns and 15 ns.

The main advantage to using such a multi-phase clock is that for a given clock rate a much higher data rate can be handled.

In the preferred embodiment using a quadrature clock, as is exemplified by FIG. 4, the decoder 100 of FIG. 2 may be adapted such that four phases may be used to clock the data signal and four phases are used to clock the strobe signal Thus, four data and strobe bits can be sampled in a single clock cycle. The adaptation of the decoder of FIG. 2 to decode the data and strobe signals using a quadrature receiver clock will be understood by one skilled in the art.

In a still further possible arrangement, as an alternative to sampling with multiple edges or phases of a clock, a single relatively slow clock may be used. In such an arrangement, the received data and strobe signals may be passed through delay lines, and multiple delayed versions of the data and strobe signals sampled.

Where delay lines are used, they may be external or internal to the silicon in which the receiver is formed. External delay lines may be made from discrete components, or from PCB traces, or using other techniques known in the art. Delay lines in silicon may vary widely in their delay, depending on process parameters, power supply and temperature, and a well-known technique for controlling the variation in such delay is to use a delay locked loop (DLL). The DLL includes a number of taps, the delay between each tap being the required delay. Although a DLL might be used for implementation of the delay lines, there are advantages in using whatever delay results, and choosing the appropriate taps. Alternatively multiplexers may be used at each tap to choose between two or more discrete delays.

Various ones of the above described sampling techniques may be combined. For instance, the technique of using multiple clock edges and delayed versions of the sample signals may be combined.

One skilled in the art will be able to determine an appropriate implementation based on the foregoing description of embodiments of the invention.

With conventional over-sampled clock and data recovery, many samples are required per bit. For example, synchronous serial ports are usually sampled at 16 samples per bit. Early transputers sampled at 5 samples per bit, and in their ICR 416 Nottingham Trent University sampled at 3 samples per bit.

With the Gray coding of the data and strobe signals, it is only necessary to ensure a sample occurs at least once during a bit-time, because each bit is delineated by an edge on either the data or the strobe at both the start and end of the bit. The technique thus offers a significant advantage over prior art sampling techniques, as the sampling clock may be run much slower.

In some cases, when there has been minimum distortion of the signals, a sample interval to bit-time ratio of very marginally less than 1 has been seen to work reliably when implementing embodiments of the invention. In practice, a ratio of 0.8 works well, provided there is not excessive distortion of the signals. For a given implementation, an appropriate ratio may be determined. Embodiments of the invention are not limited to specific ratios. Preferred embodiments utilise a ratio of less than 1. However implementations using ratios of equal to or greater than 1 are envisaged.

Where multiple clock phases are used for sampling, such as the quadrature clock of FIG. 4, the acquired samples may need to be aligned onto a single clock phase for further processing. For example, the samples of the clock phases of FIGS. 4(b), 4(c) and 4(d) may need to be aligned to the clock phase of FIG. 4(a). The alignment of the multiple phases may take place in multiple stages with the stages being separated by three or more phases. A fast clock using both edges, on the other hand, would need the alignment effectively to take place over a single phase. Thus, the use of a multi-phase clock (such as a quadrature clock) offers an advantage over the use of a fast clock in certain circumstances. Whilst a fast clock may require alignment to effectively take place over a single phase, an alternative method of alignment for a fast clock is to assemble multiple samples together for each phase, and then combine them with a lower frequency clock.

Embodiments of the invention offer a significant advantage in allowing the design of the receiver to be fully synchronous. As such, an asynchronous clock signal for each data-strobe link is no longer necessary. The receiver of each data-strobe link is synchronised to a receiver clock of the receiver block at which it is received. This offers a particular advantage on multi-port devices, such as routing switches on chips with a limited number of clock lines. If an asynchronous clock signal must be recovered and generated at each receiver port, then the provision of a limited number of clock lines may be problematic. In addition asynchronous clocks are often badly supported by design environments, and the move to a single, synchronous system clock as enabled by the invention improves design support and confidence. Secure synchronisation of a multi-bit signal is very much harder than synchronisation of a single-bit signal. Embodiments of the invention, however, mean that multi-bit signal synchronisation is no longer needed, as multi-bit signals are not provided.

In alternative embodiments where multi-bit synchronisation is needed, because multi-bit signals are provided, embodiments of the invention may readily provide such synchronisation.

Although the data is illustrated in FIG. 2 as being buffered in the data buffer 110, in practice the data may be fed directly into circuitry for further processing. The data buffer 110 in FIG. 2 is included for illustration only.

Digital signal processing techniques may be applied to the recovered data, to improve the characteristics of the data, and hence improve system performance in adverse environments. When using XOR gates for data recovery, short noise spikes can result in clock edges. However these noise spikes can be eliminated by digital signal processing. The filter characteristics applied to the decoded signals can be adjusted, dynamically, to suit the data rate being used, and to allow the data rate to be changed to match prevailing conditions.

In some circumstances, where there are multiple samples per bit, a pulse on either the data or the strobe may be seen as noise. In order to avoid this, a rule may be set in the receiver that pulses shorter than a certain number of samples may be ignored. Alternatively, if the connection is subject to significant attenuation, a single, sample-wide pulse may need to be seen as a full-width pulse.

Further digital signal processing techniques may be used if the data and strobe signals are sampled as an analogue value, rather than as simple binary values.

The data recovery technique in accordance with embodiments of the invention provide an ability to recover a sequence of samples for use in signal analysis and display. This is especially useful for development purposes. For example, the signals can be captured and displayed as a logic analyser or oscilloscope trace. In a further enhancement, an annotation of how the signals decode to characters may be provided. Such a capture may be continuous, but may also be triggered on a particular event of interest, such as an error, start-up, or a particular sequence of characters.

A prior art requirement in data strobe techniques is to maintain a close time relationship between the data and strobe signals in the transmission lines between interfaces, i.e. to minimise skew. This is essential because of the prior art techniques for recovering the clock signal to decode the data signal. As such, costly transmission lines must generally be used for conventional data-strobe interfaces, in order to minimise skew.

The nature of the data recovery provided by embodiments of the invention is such that skew between the data and strobe wires is less critical, as the decoding technique allows for a wire carrying signals arriving early to be delayed to compensate for the skew because of the sampling used. This enables lower specification cables to be used between interfaces, thus reducing system costs.

The SpaceWire link start sequence is particularly well-suited to minimising skew. The skew compensation may be carried out as follows:

i) The samples for each wire without skew compensation are taken;
ii) The edge (or transition) detection logic 142 and 144 is extended to count the difference between the number of samples between a transition on the data line to a transition on the strobe line, and transition on the strobe line to a transition on the data line;
iii) A low-pass filter is applied to this count to remove minor variations due to noise.

The earlier or later samples of the data or the strobe are selected to bring this filtered count down to zero.

The skew adjustment may be made only once, as a result of following this procedure on the relatively slow start-up sequence. Alternatively the skew adjustment may be continuous. Continuous operation, however, needs to ensure that the starting skew is considerably less than the bit period, and a dual approach of minimising skew at start-up and then continuously monitoring it and adjusting as necessary after the link speed has increased may be appropriate.

The technique of applying the skew compensation after the sampling has significant advantages because it can be performed at a comparatively low speed on signals that are well isolated from the sensitive input signals.

The SpaceWire standard, ECSS-E-50-12A, 24 Jan. 2003, takes into account the character level protocol specified in IEEE Standard 1355-1995, but defines an additional control code: a time code. The time code is a special sequence in the data stream providing a mechanism for the global distribution of system time information over a SpaceWire network.

It is a characteristic of the SpaceWire standard that responsive to receipt of a request for a time code, a time code is sent immediately after the current character has been transmitted. A request for a time code may be sent by any interface in a network to another interface, as defined in the SpaceWire standard.

SpaceWire defines 10 bit data characters, four different 4 bit control characters and two control codes: the 8 bit NULL control code and the 14 bit time code. The 14 bit time code comprises the 4 bit escape (ESC) control character followed by a 10-bit data character.

As the current character may be 4 bits long (for a control character), 8 bits long (for a NULL control code) or 10 bits long (for a data character), the delay between receipt of the request for a control code, and transmission of the control code, may vary from 0 up to 4, 8 or 10 bits. It should be noted that the 14 bit control time code is not considered here but there may also be circumstances where a request for a time code is received during transmission of a time code, and therefore the delay may be up to 14 bits.

The time codes are passed through routing switches and safely delivered regardless of the topology of the network—loops are prevented from causing deadlock. However each link in the network introduces some uncertainty—or jitter—in the arrival time of the time-code amounting to several microseconds even in a modest network. Whilst the distribution of the timing codes through routing switches in the network inevitably introduces some jitter, this jitter is exacerbated by the uncertainty in the possible delay in the time of arrival of the time code, caused by the variation in the length of the current character.

Embodiments of the invention propose a technique, for SpaceWire applications, in which time-codes are transmitted in a predictable manner responsive to a request for a time code, in such a way as to reduce jitter.

The technique of embodiments of the invention is described in relation to a specific example of transmitting time codes in a SpaceWire system. However, the embodiments of the invention may be more broadly applied, as discussed further hereinbelow following a discussion of the specific example.

The technique effectively guarantees the time of arrival of the time code relative to a reference point. This is achieved, in embodiments, by ensuring that the start of the time code is received at a fixed time-offset from the request for the time code; the end of the time code is received at a fixed time offset from the request; a point between the start and end of the time code is received at a fixed time offset from the request, or a number of bits after the time code (at which point the time code is decoded) are reached at a fixed time offset from the request. These are examples, and other variations will be apparent on reading the following examples. Thus, in general, some reference point associated with the time code is in a fixed time relation to the time of the request for the time code.

Whilst in the description reference is made to a reference point associated with a receipt of the time code, in preferred embodiments the time code is transmitted (rather than received) in a fixed time relationship to the time code request. Thus in this description where reference is made to the time code being received in a particular relationship to receipt of a time code request, this should be understood to be that the time code may be transmitted or received in a certain time relationship to a time code request.

In one embodiment, the transmit clock is varied in order to guarantee that the start of the time code is received at a fixed time offset from the request for the time code.

If a data character has just begun transmission, which is 10 bits long, then the transmit clock is not varied, and the time code inserted immediately after this character.

If a NULL control code is currently being transmitted, which is 8 bits long, then in this embodiment the transmit clock is varied by slowing, such that the end of the $8^{th}$ bit is transmitted at the time that the last bit of a 10 bit character would have been transmitted.

If a control character is currently being transmitted, which is 4 bits long, then in this embodiment the transmit clock is varied by slowing, such that the end of the $4^{th}$ bit is transmitted at the time that the last bit of a 10 bit character would have been transmitted.

The principles of these embodiments of the technique using transmit clock variation are further illustrated with reference to FIGS. 5(a) to 5(c). For the purposes of illustration, it is assumed that the request for the time code is received at the start of the transmission of a current character. Thus, for simplicity, it is assumed that a full character has to be transmitted before transmission of the time code.

Referring to FIG. 5(a), there is illustrated the case of a request TC REQ 320 for a time code being received at the beginning of transmission of a 10 bit data character 302. This represents the worst case delay possible for transmission of the time code. As shown in FIG. 5(a), with the transmit clock running at a speed $T_x$ a time t is taken before transmission of a time code 304 begins responsive to receipt of the request. The time code 304 is similarly transmitted with the transmit clock running at speed T.

Referring to FIG. 5(b), there is illustrated the case of a request for a time code being received at the beginning of a transmission of an 8 bit NULL control code 306. As shown in FIG. 5(b), with the transmit clock running at speed $T_x$ a time 4t/5 is taken before transmission of the time code 304 begins. The time code 304 is similarly transmitted with the transmit clock running at speed $T_x$. The difference in the response time to the time code request TC REQ 320 between FIGS. 5(a) and 5(b) represents uncertainty which causes jitter.

In order to provide certainty in the receipt of the time code, the transmission illustrated in FIG. 5(b) is adapted as shown in FIG. 5(c). Referring to FIG. 5(c), there is again illustrated the case of a request for a time code TC REQ being received at the beginning of the transmission of an 8 bit NULL control code. In accordance with an embodiment of this aspect of the invention, the transmit clock speed is varied for the NULL control code to ensure transmission of the time code 304 meets the worst case scenario set out in FIG. 5(a). That is, the transmit clock is adjusted such that the transmission of the time code begins at time t after the receipt of the time code request. As such, the transmit clock frequency is adjusted to a speed of $4T_x/5$. As shown in FIG. 5(c), with the transmit clock running at speed $4T_x/5$ the time t is taken before transmission of the time code 304 begins. As such, the transmission of the time code responsive to the time code request is at the fixed time t from the time of the request. The time code 304 itself is then transmitted with the transmit clock running at speed T.

Referring to FIG. 5(d), there is illustrated the case of a request for a time code being received at the beginning of a transmission of a 4 bit control character 310. As shown in FIG. 5(d), with the transmit clock running at speed $T_x$ a time 2t/5 is taken before transmission of the time code 304 begins. The time code 304 is similarly transmitted with the transmit clock running at speed $T_x$. The difference in the response time to the time code request TC REQ 320 between FIGS. 4(a) (or FIGS. 5(b)) and 5(d) again represents uncertainty which causes jitter.

In order to provide certainty in the receipt of the time code, the transmission illustrated in FIG. 5(d) is again adapted as shown in FIG. 5(e). Referring to FIG. 5(e), there is again illustrated the case of a request for a time code TC REQ being received at the beginning of the transmission of an 8 bit control character. In accordance with an embodiment of this aspect of the invention, the transmit clock speed is varied for the NULL control code to ensure transmission of the time code 304 meets the worst case scenario set out in FIG. 5(a). That is, the transmit clock is adjusted such that the transmission of the time code begins at time t after the receipt of the time code request. As such, the transmit clock frequency is adjusted to a speed of $2T_x/5$. As shown in FIG. 5(e), with the transmit clock running at speed $2T_x/5$ the time t is taken before transmission of the time code 304 begins. As such, the transmission of the time code responsive to the time code request is at the fixed time t from the time of the request. The time code 304 itself is then transmitted with the transmit clock running at speed $T_x$.

FIGS. 5(c) and 5(e) illustrate simple cases of adjusting the clock speed to provide certainty, for the case where the time code request happens to coincide with the beginning of the transmission for the current character. For completeness, a further example is illustrated with reference to FIGS. 5(f) and 5(g).

Referring to FIG. 5(f), there is shown a situation similar to that of FIG. 5(a), where a request for a time code TC REQ 320 is received during transmission of a NULL control code 314. However in this example, the request TC REQ is received after transmission of the NULL control code is well under way. As illustrated in FIG. 5(g), as such the time between the time code request and the beginning of the time code transmission is significantly less than time t, by an amount designated t. Thus, once again, uncertainty arises in the timing of the transmission of the time code responsive to the time code request.

In practice, the timing of the arrival of the request for a time code is most likely to be during a transmission for a character as opposed to directly at the beginning thereof, and therefore FIG. 5(f) represents a more typical scenario.

In order to provide certainty in the receipt of the time code, the transmission illustrated in FIG. 5(f) is again adapted as shown in FIG. 5(g). Referring to FIG. 5(g), there is again illustrated the case of a request for a time code TC REQ being received during the transmission of a NULL control character 316. The transmit clock speed for transmitting the NULL control character 316 begins at speed $T_x$. In accordance with an embodiment of this aspect of the invention, on receipt of the time code request TC REQ 320 the transmit clock speed is then varied for the NULL control code to ensure transmission of the time code 304 meets the worst case scenario set out in FIG. 5(a). That is, the transmit clock is adjusted such that the transmission of the time code begins at time t after the receipt of the time code request TC REQ 320. As such, the transmit clock frequency is adjusted to a speed of $T_x/n$, where n represents a determined divide factor to provide the necessary delay. As shown in FIG. 5(e), with the transmit clock running at speed $T_x/n$ the time t is taken before transmission of the time code 304 begins. As such, the transmission of the time code responsive to the time code request is at the fixed time t from the time of the request. The time code 304 itself is then transmitted with the transmit clock reverting to running at speed $T_x$.

In preferred embodiments, the technique of varying the transmit clock is distributed throughout the system, such that jitter is minimised at all routing switches. This results in a much improved system performance for jitter.

Figure 5:
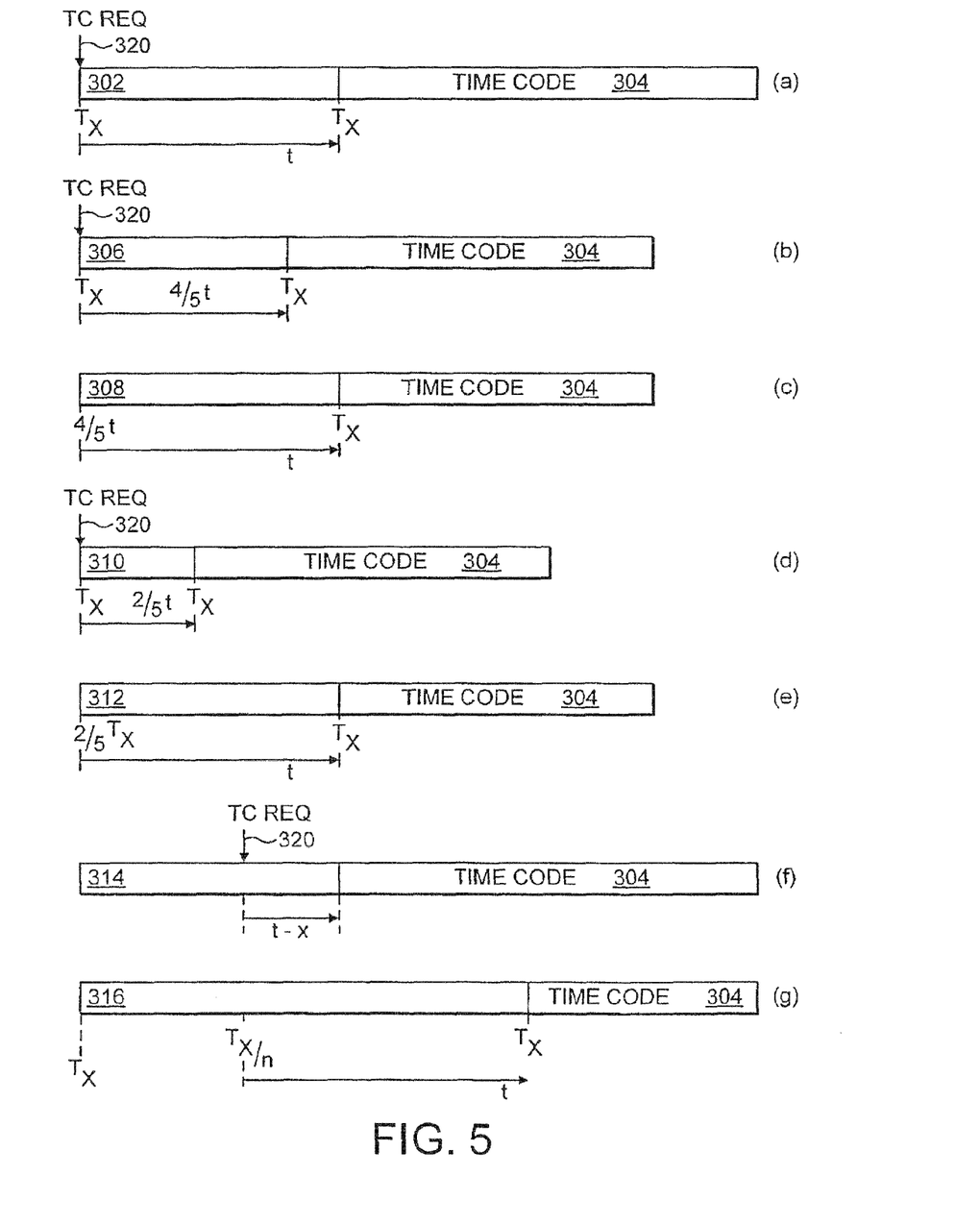
FIG. 5 illustrates the timing control of signals in an embodiment of an aspect of the invention.

The technique for minimising jitter described in relation to FIG. 5 can advantageously be combined with the technique for clock recovery described in relation to FIGS. 2 and 3. As the data recovery technique illustrated herein with reference to FIGS. 4 and 2 is dependent on a fixed system clock, then the recovery technique is not affected by a variable transmit clock, provided the slowest transmit clock speed is within the tolerance of the receive system clock.

It should be noted that the 'lengthening' of a time period in order to ensure the time code arrives at a predetermined time offset may be achieved in a number of ways. In the above description, it is stated that the clock speed is varied over a fixed period. The clock speed may, in alternatives, be varied only over selected parts of the period, such as selected bits. In addition the clock speed may vary by more than one factor during the period. The data-strobe transmission technique permits the transmit clock speed to be varied from bit to bit, within the confines of the maximum clock speed. This allows the bit period to vary from bit to bit. When used in conjunction with the data recovery technique described elsewhere herein, the variation of the bit period from bit to bit does not cause any problems, provide the sampling clock t the receive side operates sufficiently fast in any given bit period. Preferably, the sampling clock should have a lower limit of speed of operation based on the longest possible transmit bit period.

The technique thus introduces a delay in the transmission of the time code in certain cases, but provides certainty of the response time in all cases. The start or end time, or reference point, of the time code relative to the time of the request are certain. This certainty provides reduced jitter.

As mentioned, the implementation of the techniques to reduce jitter described herein with reference to FIG. 5 require no adaptation to the processing techniques on the receive side. The processing techniques on the transmit side do require some adaptation, to include the functionality necessary to vary the transmit clock speed to ensure the time t between receipt of a request and transmission of the time code.

Figure 6:
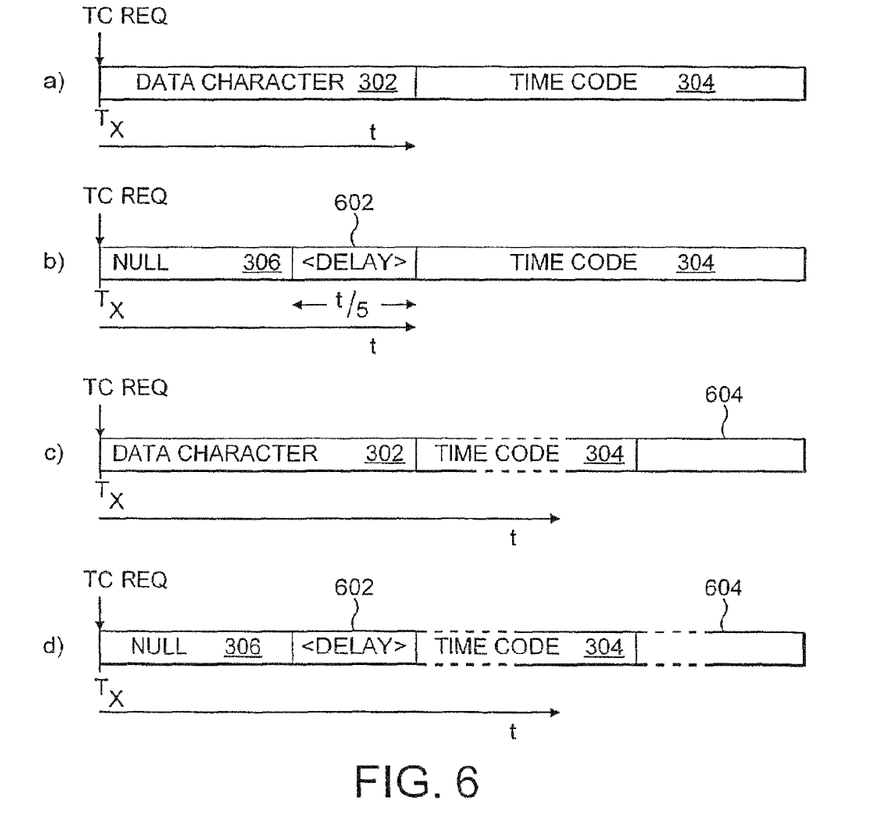
FIG. 6 illustrates the timing control of signals in an alternative embodiment of an aspect of the invention.

An alternative embodiment to the technique of varying the transmit clock speed, as illustrated by FIG. 5, is presented in relation to FIG. 6. In the alternative technique the transmit clock speed is not varied. In order to provide certainty of receipt of a reference point with relation to the time code, delays are inserted where necessary.

Referring to FIG. 6(a), there is again illustrated receipt of a request for a time code TC REQ at the start of the transmission point of a data character 302. At a time t after receipt of the request, the time code 304 is transmitted.

Referring to FIG. 6(b), there is shown the use of delays in order to ensure the time code 304 is still transmitted at the time offset t responsive to a time request, for a NULL control code 306. At the end of the 8 bits of the NULL control code 306, a 2 bit 402 is inserted, such that time code 304 is transmitted at a time t after receipt of the time code request.

Various embodiments may require the reference point for transmission of the time code to be different. Thus, as discussed hereinabove, it may be required that the start of the time code be at a known time delay, the end of the time code be at a known time delay, a point within the time code be at a known time point, or a point after the time code be at a known time point. In particular, the time code is decoded, and the contents thereof verified, for example, 6 bits after receipt of the last bit of the time code. As such, an advantageous reference point may be 6 bits after receipt of the time code.

Referring to FIG. 6(c), there is illustrated an example in which the time code 304 is delayed even for a data character transmission, which is the worse case scenario for transmitting a time code. Referring to FIG. 6(c), the fixed time period t from receipt of the time code request is set to be 6 bits after receipt of the time code 304. Referring to FIG. 6(d), which once again illustrates the transmission of a NULL control code 306, a delay 606 of 8 bits is inserted after transmission of the NULL control code 306, such that the time period t for receipt of 6 bits after the end of the time code 304 is satisfied.

The technique of inserting delays to ensure certainty of receipt of the reference point with relation to the time code is shown in FIG. 6 as being insertion of a block delay, between the end of the transmission of the current character and the commencement of the transmission of the time code. Delays may be implemented in alternative ways. For example, the delay may be spread across every bit of the time period. For example in FIG. 6(d), each bit of the time code 304 could be associated with a delay, such that the time constraint t for receipt of the 6$^{th}$ bit after the end of the time code is still satisfied. The delay may be applied to some or all of the bits of the time code and some or all of the bits after the time code. The delay may be in the time code bits, may be in the bits of the current character being transmitted, may be in additional bits before or after the time code, or may be any combination of such.

Certain standards may require a maximum limitation on the time period for which a signal is inactive, and therefore the spreading of the delay over a number of bits may be preferred to the use of a single block delay.

This embodiment of the invention, as illustrated with FIG. 6, therefore introduces a delay in the transmitted signal, without varying the transmit clock, to ensure certainty in the time of receipt of a reference point associated with the time code responsive to a time code request.

In a further modified embodiment, the transmit clock variation technique of FIG. 5 may be combined with the delay technique of FIG. 6.

It should be noted that FIG. 6, as with FIG. 5, illustrates for simplicity purposes the idealised scenario where the request for the time code is received immediately at the point that the transmission of the current character begins. The technique is not limited to the receipt of the time code request at this point in time.

Figure 7:
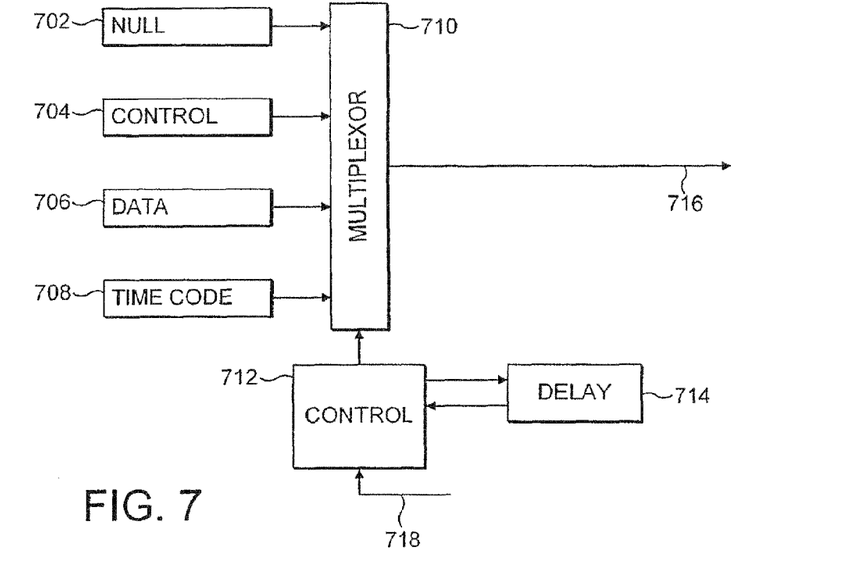
FIG. 7 illustrates an exemplary implementation of an encoder in an embodiment of the invention.

Referring to FIG. 7, there is illustrated, in block diagram form, an implementation in the encoder for utilising the delay technique illustrated with reference to FIG. 6.

Referring to FIG. 7, there is illustrated four block 702, 704, 706, 708 representing channels for the transmission of characters. The block 702 is a channel representing the transmission of the 8 bit NULL control code, the block 704 is a channel representing transmission of the 4 bit control characters, the block 706 is a channel representing the transmission of the 10 bit data characters, and the block 708 is a channel representing transmission of the 14 bit time codes. The implementation of an encoder to ensure the appropriate characters are placed on the output line of the encoder is well-known to one skilled in the art. The data block 706 may represent a continuous data channel, for example. The time code block 708 may represent a block of stored possible time codes, which are selected under control means, for example.

Block 710 represents a multiplexer, which is controlled by a control signal from a control block 712, to output on an output line 716 information from one of the channels represented by the block 702, 704, 706, 708. The control of the multiplexer 710 to output the appropriate channels is outside the scope of the present invention, being within the scope of one skilled in the art. The invention does not propose any technique to modify such selection.

In accordance with embodiments of the present invention, the control block 712 receives a request for a time code TC REQ on a line 718. In accordance with embodiments of the present invention, the control block 712 is modified to transmit a signal to a delay block 714, for calculating any necessary delay needed in the transmission of the time code in order to provide certainty in the receipt of the time code reference point in a particular time frame.

The delay block 714 may receive from the control block 712 the identification of a current character being transmitted, together with identification of the current time elapsed in that transmission. Therefrom, the delay block 714 is able to calculate an appropriate delay to be inserted between the end of the current character and the commencement of the time code transmission. This calculated delay is returned by the delay block 714 to the control block 712. At the end of the current transmission, the control block 712 waits for the appropriate delay time before switching the multiplexer 710 to transmit the appropriate time code from the charmel represented by a block 708.

The embodiments of the present invention with reference to FIGS. 5, 6, and 7 have been specifically related to the transmission of time codes in a SpaceWire system. However the principles may be extended to broader application.

In general, the embodiments described relate to a technique in which any block of information may be controlled by a transmitter so as to ensure that the block of information is transmitted or received with a fixed time relationship to a reference point, relative to receipt of a request for that information to be transmitted. In the SpaceWire example described hereinabove, this enables time codes to be transmitted with a known time relationship to a reference point associated with the time code responsive to a request for a time code. More generally, this principle is not limited to time codes, or even to timing information. Any information may be transmitted using this principle.

Thus, in general, response to receipt of a request for the transmission of a block of information, the transmission of that block of information may be controlled, by way of delay if necessary, to ensure that a reference point associated with that block of information is received or reached at a fixed time relationship from receipt of the request for the information.

Thus, responsive to a request for transmission of the information, the start of the information, the end of the information, or some reference point before, during or after the information, is in a fixed relation in time to the initial request.

The technique described with relation to the exemplary embodiments of FIGS. 5 and 6 may thus be used to accurately time the transmission of any information, be it control, data, or timing information for example. The technique works on any asynchronous transfer, where transfers can start at arbitrary times. The technique is applicable, therefore, in RS 232 transmission for example. A delay may be used to place a transfer at a chosen time.

In the context of the specific example of SpaceWire, this technique may be utilised to synchronise all nodes in a system. The technique described hereinabove describes embodiments where the time-code transmission or receipt of a given link is given certainty by controlling the timing of the transmission of that time code. In a system, where multiple time codes are requested by nodes of multiple links, some nodes receive their time codes before others. The order of receipt is deterministic for a given time code source.

In further embodiments of the invention, the early time-codes generated in certain links may be further delayed, such that the time codes are generated at the same time for all links. As such, not only is the receipt of a time code for a given link given certainty, but the time relationship is common throughout the system, thereby further reducing system jitter. The delays added for particular links allow for the link latency, such as the delays caused by the routing switches in the link and also the delays added by the connecting cables in the link. These delays are compensated for differently in each link, in order to ensure the receipt of the time code in each link is consistent.

In general, this principal allows for system synchronisation by delaying the transmission (or receipt) of information in a link in accordance with the worst case time delay for a link in the system.

Thus the preferred embodiment of the invention introduces into each link a fixed time relationship between the transmission and/or receipt of information responsive to a request for that information, based on the worst case transmission delay within that link, and the worst case transmission delay within the system. The worst case transmission delay within the link is typically the same for each link, being the most number of bits that may have to be transmitted before the request can be handled. The worst case transmission delay within the system is typically the link in the system having the longest latency. For that link there is no extra delay introduced, for other links an appropriate delay is introduced.

As exemplified by the foregoing discussion with relation to FIGS. 5 to 7, the "data-strobe" encoding technique facilitates for the bit rate of a transmitted data signal to be varied. As discussed hereinabove, the bit rate may be varied by varying the transmit clock rate, or by inserting delays into the transmitted signal. The overall effect, in either case, is the rate of information transmitted is varied.

This is possible with "data-strobe" encoding techniques, since the transmit clock, in conventional system, is recovered at the receiver. In embodiments of the invention described herein, the data signal is recovered by way of sampling the received signals, and the only proviso is that the variable clock rate must stay within the necessary confines to ensure proper sampling of the receiver.

The following, further embodiments of the invention are discussed, in which additional information is encoded in transmitted data signal, to effectively provide an additional data channel, by varying the width of any data period, i.e. by varying the rate of data transmission. It should be noted in this respect that by reference to "data", there is conveyed a general meaning of "information". Thus the data may be actual data or control information such as timing information.

Figure 8:
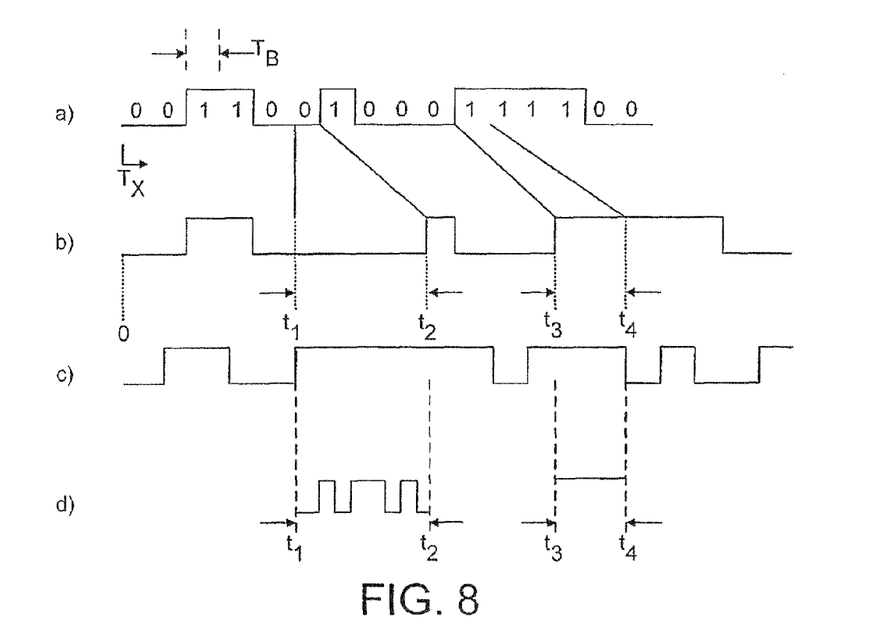
FIG. 8 illustrates the timing control of signals in an embodiment of the invention.

Referring to FIG. 8, there is illustrated an exemplary implementation of this embodiment of the invention. FIG. 8(a) illustrates a data sequence for encoding for transmission. The data sequence of FIG. 8(a) has a constant data bit width $T_B$, based on a data clock rate of $T_X$.

In accordance with embodiments of the invention, the width of selected data bits is varied. Referring to FIGS. 8(a) and 8(b), the $6^{th}$ data bit of the data sequence of Figure (a) is controlled such that its width is varied to a width 4 $T_B$. As also shown in FIG. 8(b), the $11^{th}$ data bit of the data sequence of FIG. 8(a) is varied such that its width is increased to two $T_B$.

The variation in the bit widths of these bits, may be achieved in either of the ways described hereinabove with reference to FIGS. 5 and 6. Delays may be inserted without causing any variation to the transmit clock $T_X$. Alternatively, the transmit clock $T_X$ may be slowed down to length the bit widths.

Referring to FIG. 8(c), there is shown a corresponding encoded strobe signal based on the data signal of FIG. 8(b).

As can be seen, transitions only occur in the strobe signal for data bit boundaries where there is no transition in the data signal of FIG. 8(b). Thus, on the received side, when the data-strobe signals of FIGS. 8(b) and 8(c) are recovered, the data sequence of FIG. 8(a) will be recovered. Thus, the width of any particular bit in the data sequence can be varied, without effecting the decoding of the signal at the received side.

In the preferred embodiments of the invention, the increased width for the selected bits of the data signal, is used to encode additional information for use in the receiver. The advantage of encoding additional information in such a way, is that if the receiver is not adapted to receive such information, then the operation of the receiver is unaffected by this additional information, and the data-strobe signal is decoded in a conventional way.

However, as shown in FIG. 8(d), the extended bit periods for selected bits may be used to contain additional encoding information. As shown in FIG. 8(d), between the time periods $t_1$ and $t_2$, representing the extended width of the $6^{th}$ data bit, an additional signal is encoded, which may be decoded by an appropriately adapted receiver. This information may, for example, be additional data information, or be control information.

As further shown in FIG. 8(d), between the time periods $t_3$ and $t_4$ of the $11^{th}$ extended data bit, no signal variation is added. In this embodiment, the length of the extended data bit is used to convey information. In an alternative, the length could be shortened.

Thus, the duration of any bit may be changed, and further information conveyed by modulating the signal during that duration. The modulated bit width may be used to encode information in itself, for example a one second addition may represent a bit 0 and a two second addition may represent a bit 1.

Various uses for this technique for encoding additional information are envisaged. For example, the additional information may be the basis of a protocol for negotiating a speed between two ends of a link.

This technique may additionally be used in RS 232 communication links. An RS 232 character comprises a start bit, followed by a set of data bits, followed by a stop bit. The gap between successive characters is not defined. This gap may therefore be varied, in accordance with this technique, to encode further information.

The extra information encoded could be analogue information, such as an analogue television channel.

In conventional data-strobe systems, the signal after decoding at the output of the exclusive OR gate is a carrier, and the embodiments of the invention described herein modulate that carrier in order to convey additional information.

The various aspects and embodiments of the invention described herein have particular advantages when utilised in the context of the SpaceWire standard. However advantages of the invention are provided in more general applications. In particular, embodiments of the data recovery technique described herein may be advantageously applied in any system utilising so-called data-strobe signalling, and preferably where an embedded clock is provided at the receiver. The scope of protection afforded by the aspects and embodiments of the invention are defined by the appended claims.

We claim:

1. A machine implemented method of transmitting data in a communication system, comprising:
   receiving a request for data to be transmitted during a current data transmission;

transmitting a signal including said data in response to said request after completion of the current data transmission; and controlling the transmission of the signal including said data in response to said request such that a reference mark associated with said data is a fixed time interval from receipt of the request, wherein the transmission of said signal including said data is controlled by inserting delays in the transmitted signal including said data.

2. The machine implemented method according to claim 1, wherein said reference mark is one of: a start of the transmission of the data; an intermediate point of the transmission of the data; an end of the transmission of the data; a fixed time after completion of the transmission of the data.

3. The machine implemented method according to claim 1, wherein inserting delays comprises inserting a block delay.

4. The machine implemented method according to claim 1, wherein inserting delays comprises inserting delays spread throughout the transmitted signal including said data.

5. The machine implemented method according to claim 1, wherein inserting delays comprises inserting a delay with one or more transmitted bits.

6. The machine implemented method according to claim 1, wherein the transmission of said signal including said data is controlled by varying the transmission speed of the transmitted signal including said data.

7. The machine implemented method according to claim 1, wherein the data is a time code of a SpaceWire system.

8. The machine implemented method according to claim 1, wherein the step of controlling the transmission of the signal including said data comprises determining the length of the current data transmission after receipt of the request, and determining the difference between said length and said fixed time interval, and adjusting the transmission such that a remaining length of the current data transmission is selectively adjusted in order to meet the fixed time interval constraint.

9. The machine implemented method according to claim 1, wherein the fixed time interval is dependent upon a worst-case delay determined by the potential worst-case length of the current data transmission.

10. The machine implemented method according to claim 1, wherein the fixed time interval is dependent upon a worst case delay caused by latency in one of a plurality of transmission links in a system.

11. The machine implemented method according to claim 1, wherein the step of controlling the transmission of the signal including said data comprises determining the latency of the transmission, and determining the difference between said latency and said fixed time interval, and adjusting the transmission such that the remaining length of the current data transmission is selectively adjusted in order to meet the fixed time interval constraint.

12. The machine implemented method according to claim 1, wherein the transmitted signal including said data is encoded using data-strobe encoding techniques such that a transmit clock is recovered at a receiver.

13. The machine implemented method according to claim 1, wherein the step of receiving a request for data during a current data transmission is performed by a receiver.

14. The machine implemented method according to claim 13, wherein the step of transmitting said signal including said data in response to said request after completion of the current data transmission is performed by a transmitter, and wherein the step of controlling the transmission of said signal including said data in response to said request such that a reference mark associated with said data is a fixed time interval from receipt of the request is performed by a controller.

15. The machine implemented method according to claim 1, wherein the step of transmitting said signal including said data in response to said request after completion of the current data transmission is performed by a transmitter.

16. The machine implemented method according to claim 1, wherein the step of controlling the transmission of said signal including said data in response to said request such that a reference mark associated with said data is a fixed time interval from receipt of the request is performed by a controller.

17. A transmitter for transmitting information, comprising: a receiver configured to receive a request for information to be transmitted during a current information transmission; a transmitter configured to transmit a signal including said information after completion of the current information transmission; and a controller configured to control the transmission of said signal including said information such that delays are inserted in the transmitted signal including said information, and a reference mark associated with said information is a fixed time interval from receipt of the request.

18. A system comprising at least one transmitter according to claim 17.

* * * * *

UNITED STATES PATENT AND TRADEMARK OFFICE
CERTIFICATE OF CORRECTION

| | | |
|---|---|---|
| PATENT NO. | : 9,529,771 B2 | Page 1 of 1 |
| APPLICATION NO. | : 12/890122 | |
| DATED | : December 27, 2016 | |
| INVENTOR(S) | : Christopher Paul Hulme Walker et al. | |

It is certified that error appears in the above-identified patent and that said Letters Patent is hereby corrected as shown below:

In the Specification

Column 14,
Line 23, "speed T," should read --speed $T_x$--

Column 14,
Line 52, "speed T," should read --speed $T_x$--

Column 18,
Line 16, "the charmel," should read --the channel--

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*